United States Patent [19]
Brunner et al.

[11] Patent Number: 5,300,786
[45] Date of Patent: Apr. 5, 1994

[54] OPTICAL FOCUS PHASE SHIFT TEST PATTERN, MONITORING SYSTEM AND PROCESS

[75] Inventors: Timothy A. Brunner, Ridgefield, Conn.; Michael S. Hibbs, Westford, Vt.; Barbara B. Peck, Westford, Vt.; Chrisopher A. Spence, Westford, Vt.

[73] Assignee: International Business Machines Corporation, Armonk, N.Y.

[21] Appl. No.: 967,885

[22] Filed: Oct. 28, 1992

[51] Int. Cl.$^5$ ............................................. G01N 21/86
[52] U.S. Cl. ................................... 250/548; 356/401
[58] Field of Search ............... 250/548, 201.2, 201.3, 250/201.4, 201.5, 201.6, 201.7, 201.8; 356/401

[56] References Cited

U.S. PATENT DOCUMENTS

| | | | |
|---|---|---|---|
| 4,631,416 | 12/1986 | Trutna, Jr. | 250/548 |
| 4,664,524 | 5/1987 | Hattori et al. | 356/401 |
| 4,772,119 | 9/1988 | Bouwhuis et al. | 356/124 |
| 4,780,615 | 10/1988 | Suzuki | 250/548 |
| 4,824,254 | 4/1989 | Ohtsuka et al. | 356/401 |
| 4,838,693 | 6/1989 | Uchida et al. | 356/356 |
| 4,890,309 | 12/1989 | Smith et al. | 378/35 |
| 4,902,133 | 2/1990 | Togo et al. | 356/356 |
| 4,923,301 | 5/1990 | White | 356/356 |
| 4,974,962 | 12/1990 | Stephens et al. | 356/356 |
| 5,009,506 | 4/1991 | Spies | 356/356 |
| 5,126,220 | 6/1992 | Tokitomo et al. | 250/398 |

FOREIGN PATENT DOCUMENTS

0401795A2 of 1990 European Pat. Off. .
0461778A1 of 1991 European Pat. Off. .
0462560A1 of 1991 European Pat. Off. .

OTHER PUBLICATIONS

Flamholz, et al., "High Resolution Mask Overlay Comparator", IBM Technical Disclosure Bulletin, vol. 21, No. 7, pp. 2839-2844, 1978.
Ohtsuka, et al., "A Novel Multiple Focus Position Control Method By Conjugate Twin-Shifter Phase Shift Lithography", IEEE, IEDM, pp. 59-61, 1991.
Kirk, Joseph, "Astigmatism and Field Curvature From Pin-bars", SPIE Optical/Laser Microlithography IV, vol. 1463, 1991.
Adams, Thomas, "Applications of Latent Image Metrology in Microlithography", SPIE, vol. 1464, pp. 1-10, Mar. 1991.

*Primary Examiner*—David C. Nelms
*Assistant Examiner*—T. Davenport
*Attorney, Agent, or Firm*—Heslin & Rothenberg

[57] ABSTRACT

A photolithography mask structure having a novel optical focus test pattern is described. The mask structure has a non-phase-shifted, transparent substrate and includes a phase shifter of other than 180° disposed between spaced, parallel opposing lines such that an alternating pattern of non-phase-shifted material and phase-shifted material is defined transverse said parallel lines. When projected onto the surface of an object measurable shifts of the test pattern corresponds in direction and magnitude with the extent of system defocus. Various alternating test pattern embodiments are presented, all of which include at least one phase shift window of other than 180° in relation to the mask substrate. Further, a monitoring system and a monitoring process are discussed employing the presented mask structures.

30 Claims, 7 Drawing Sheets

OPTICAL FOCUS PHASE SHIFT TEST PATTERN, MONITORING SYSTEM AND PROCESS

TECHNICAL FIELD

The present invention relates in general to photolithographic projection of a pattern onto a semiconductor wafer, and more particularly, to a phase shift mask pattern which results in a projected resist pattern which can be measured to determine the direction and magnitude of system defocus error. Typically, the resist patterns are spaced, parallel opposing lines where the center-to-center spacings are critically determined by system defocus error. The invention also relates to a monitoring system and monitoring process which employ such a mask structure.

BACKGROUND ART

With the trend toward ever higher integration of integrated circuits, photolithography patterns formed on a semiconductor substrate are continually becoming increasingly fine and precise. Linewidth control of micro-lithographic processes is negatively impacted by numerous effects, such as resist thickness variations, bake non-uniformities, batch-to-batch resist sensitivity changes, thin film interference effects (e.g., swing curve), non-flat wafers, lens field non-flatness, etc. Many of these issues can be classified as producing an effective focus change. Therefore, to improve linewidth control one must either improve the focus window of the process or reduce the focus variations. A key problem in accomplishing either approach is to accurately measure the focus variations present in practical processes.

Determination of optical focus in photolithography has always been a time-consuming and relatively uncertain process. Traditionally, focus is determined by exposing a matrix of fields through a range of focus settings, then inspecting the resultant patterns for the best looking images. Experienced operators can be quite good at this, but the process is necessarily slow and always inherently subjective. A variety of automated schemes for determining tool focus have also been developed. Most of these methods use an aerial image monitor of some sort to determine the spatial location of best focus. The wafers being exposed are then placed at this best focus location (or at a predetermined offset from this position) by high-precision mechanical means. Although in the abstract such a technique is very accurate, in practice it is susceptible to slight drifts in the wafer positioning mechanism or changes in the required focus offset induced by changes in the film stack from one batch of wafers to the next.

Both of the above-noted focusing techniques are used to set up lithographic equipment to expose the best possible image. But after a wafer is exposed, developed, and inspected, there is no good method for confirming that focus was good while the wafer was being exposed. Loss of image quality can be seen by subjective inspection of a wafer, and loss of linewidth control can be confirmed by scanning electron microscope (SEM) linewidth measurement, but image quality and linewidth control are affected by many variables besides focus. Even if an image appears obviously out of focus to an experienced operator, it is impossible to determine quantitatively how many microns the focus offset has shifted, or even whether the shift has been in a positive or negative direction.

Therefore, a means of unambiguously determining focus accuracy (e.g., from a structure on the kerf of a product wafer) would be a valuable asset to the effort to control lithographic tools and enhance the lithographic process. Even greater value in terms of time savings would be achieved if the monitor structure/process could quantitatively measure the magnitude and sign of the defocus. If measurable, this information could be used to adjust the exposure tool without the need of a focus check using one of the conventional focus evaluation techniques.

DISCLOSURE OF INVENTION

The present invention provides a focus measurement technique for use in a projection imagery system. A special mask structure is used with phase shifters having a phase angle other than the usual 180°. Typically, this phase angle would lie in the range of 40°–140°. Through the usual practice of photolithography, the mask structure is projected onto an object surface (typically a wafer coated with photoresist) and a pattern is formed on the object. Because of the unusual imaging characteristics of non-180° phase shifters, focus offsets will create measurable shifts in the projected patterns. This general concept can be embodied by numerous specific examples, several which are now given.

Thus, in one aspect of the present invention a focus mask structure is provided for use in a projection imagery system. The mask structure is used to project a test pattern onto an object surface, with measurable shifts of the projected pattern corresponding to system defocus. The mask includes a transparent substrate and first and second opaque lines disposed in association with the substrate in a predefined spaced relationship. A phase shifter, associated with the substrate and disposed between the lines, produces a phase difference between light passing therethrough and light passing through other areas of the substrate. This phase difference is other than 180°, for example, 90°. A test pattern is thus defined transverse the opposing lines. When optically projected onto the surface of an object, the direction and magnitude of optical defocus is determined by measuring the center-to-center spacings, i.e., the pitch, of the two parallel lines. Various embodiments of the basic mask structure are possible. For example, the mask's transparent substrate could comprise non-phase-shifted material and an alternating pattern of phase-shifted windows and non-phase-shifted windows could be employed between a plurality of spaced, parallel opaque lines.

By way of further example, pursuant to the present invention a focus test mask for the above-described projection imagery system could include a transparent substrate upon which three opaque lines are formed. The opaque lines are spaced apart in a predefined relationship, with a second opaque line being disposed between a first opaque line and a third opaque line. A first window of phase shift material is formed in association with the substrate to produce a phase difference of other than 180° between light passing therethrough and light passing through the substrate. The first phase shift window is disposed partially between the first line and the second line. A second window of phase shift material is also formed in association with the substrate to produce a phase difference of other than 180° between light passing therethrough and light passing through the substrate. The second phase shift window is disposed partially between the second opaque line and the third opaque line. The second phase shift window and the first phase shift window are offset relative to the second opaque line such that two offset test patterns of phase-shifted windows are formed transverse the opposing lines. When projected onto an object surface, the shift of the second line relative to the first and third lines is representative of the direction and magnitude of optical defocus.

In another aspect, an optical focus monitoring system is presented for use in connection with a projection imagery system having an illumination source and a focusing lens. The monitoring system includes a focus test mask to be disposed between the illumination source and the lens for projecting a fine test pattern onto an object surface. The mask includes a substantially non-phase-shifted transparent substrate upon which two opaque lines are produced. The opaque lines are spaced apart in predefined relation and a window of phase shift material is disposed therebetween such that an alternating test pattern of non-phase shift material and phase shift material is defined transverse the parallel lines. The phase shift window produces a phase difference of other than 180° between light passing therethrough and light passing through the non-shifted substrate. An optical measuring and calculating system evaluates the fine test pattern projected onto the object surface lines by measuring the spacing between the lines of the resultant pattern on the object surface. The spacing between the patterns correspond to the direction and magnitude of system defocus.

In still another aspect of the present invention, a method for monitoring optical defocus of an object surface in a projection imagery system is presented. The monitoring method includes providing a focus test mask having a non-phase-shifted, transparent substrate, first and second opaque lines formed on the substrate in a predefined spaced relationship, and a window of phase shift material disposed therebetween such that an alternating test pattern of non-phase-shifted material and phase-shifted material is defined transverse the spaced lines. The phase-shifted material produces a phase difference of other than 180° between light passing therethrough and light passing through the non-phase-shifted substrate. The method further includes illuminating the focus test mask to project the alternating test pattern onto an object surface through the imagery system's focus lens. Finally, shifts in the projected test pattern are measured to provide an indication of system defocus. Process enhancements are also described and claimed.

Thus, a novel mask structure, focus monitor and monitoring process are presented with improved accuracy in comparison with the conventional focus matrix methods for determining system defocus. The techniques presented determine focus from a parameter (e.g., pitch or linewidth) that varies linearly with defocus. This is an inherently more accurate measurement than conventional techniques relying on finding an extremum of some measured quantity, e.g., a linewidth. With the approach presented, the focus of each chip of a semiconductor wafer can be routinely checked as part of product fabrication. Another advantage of the present technique is that only a single exposure is required to make a measurement, which is opposed to all conventional techniques wherein analysis of a series of exposures is required. Similarly, the approach could be used to periodically verify the accuracy of existing auto-focus systems. The presented focus monitor is expected to yield great benefits in pattern resolution on future products, and should be readily applicable to all existing fabrication programs.

BRIEF DESCRIPTION OF DRAWINGS

These and other objects, advantages and features of the present invention will be more readily understood from the following detailed description of certain preferred embodiments thereof, when considered in conjunction with the accompanying drawings in which.

BEST MODE FOR CARRYING OUT THE INVENTION

Reference should now be made to the figures wherein the same reference numbers may be used throughout different figures to designate the same or similar components.

Figure 1:
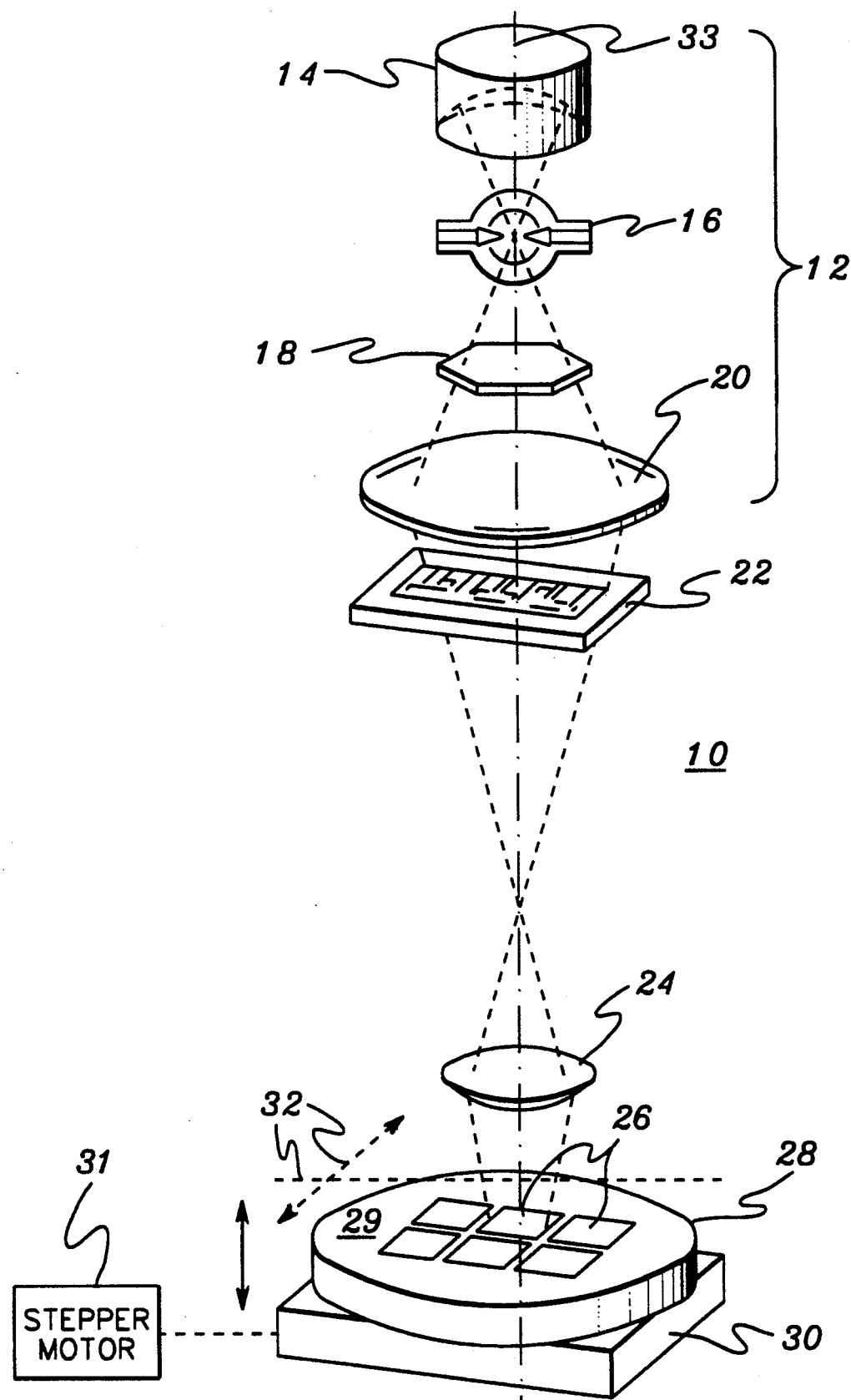
FIG. 1 is an exploded perspective view of certain principal components of a projection imagery system incorporating the present invention.

A partial embodiment of a projection imagery system, generally denoted 10, is shown in FIG. 1. System 10, commonly referred to in the semiconductor fabrication industry as a "wafer stepper", includes an illumination source 12 comprising a mirror 14, a mercury (Hg) arc lamp 16, a light filter 18 and a condenser lens system 20. Illumination source 12 outputs "light" to a mask structure 22 which is pre-patterned as desired, e.g., to project a wiring level of an integrated circuit under fabrication. (As used herein, the term "light" refers to light used in photolithography. The terms "light" and "photolithography" in the specification need not be restricted to visible light, but can also embrace other forms of radiation and lithography.) Light passing through mask structure 22 intersects a reduction lens 24 which focuses the mask pattern into particular lens fields 26 fabricated on a semiconductor wafer 28. Wafer 28 is held in position by a vacuum hold device (or chuck) 30, the position of which is controlled by an accurate X,Y,Z location controller or stepper motor 31.

Focus is typically quantified as an offset error in the location of wafer 28 (or, more particularly, surface 29) in the Z-axis dimension 33 relative to a perfectly focused image plane 32. This focus offset or defocus (measured, for example, in micrometers) has a positive or negative Z-axis displacement with respect to ideal focal plane 32, along with a magnitude representative of the distance by which surface 29 is offset from the ideal focal plane. By determining the direction of misfocus (i.e., the positive or negative Z-axis translation of wafer 28), along with an actual offset displacement measurement, accurate adjustment of wafer 28 for proper focus can be readily accomplished. For example, through manual or automated adjustment of the position controller 31 controlling the X,Y,Z location of wafer 28 within wafer stepper 10 the wafer could be repositioned to reduce focus error so as to improve system resolution.

From extensive experimental and theoretical studies of phase shift mask techniques, it has been discovered that a phase shifter of other than 180° will result in a measurable shift of the resulting printed pattern on the surface of the wafer. Pursuant to the present invention, therefore, a pattern consisting of alternating phase-shifted and non-phase-shifted transparent lines is used to show measurable shifts in a projected test pattern when the phase shift angle is other than 180° and the focus is less than perfect. When at best focus, these shifts will be zero. This concept is exploited by the present invention in the mask structures, focus monitoring system and monitoring process described herein below.

Figure 2:
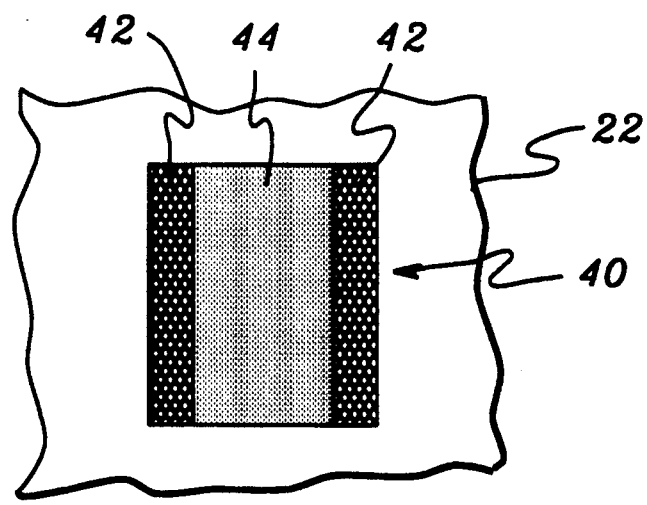
FIG. 2 is a planar view of one embodiment of a focus mask test pattern pursuant to the present invention.

FIG. 2 depicts one embodiment of a mask structure 40 pursuant to the present invention. Structure 40 is formed on a transparent mask substrate 22 of glass or quartz and includes in a basic aspect two light-shielding lines 42 which are spaced apart a known distance in parallel opposing relation. Opaque lines 42 (sometimes hereinafter called shield lines) are, e.g., fabricated of chromium (Cr) or a chromium compound and are formed by conventional methodologies. Disposed between shield lines 42 is a window of phase shift material 44 formed either above or within substrate 22. (A window of phase shift material is also sometimes referred to herein as a "phase shifter.") When employed in a wafer stepper, light rays impinging on the back surface of the mask structure travel through the structure and undergo different phase shifts due to the existence of phase shifter 44.

Several techniques for placing 180° phase shifters on a lithographic mask have been developed and are discussed in the open literature. Most of these techniques involve either deposition and patterning of blanket films with a controlled phase shift or etching into the mask substrate by a controlled amount in the regions where the phase shift is desired. Any of these techniques could be used to produce the grating structure proposed herein with a phase-shifted window of other than 180° relative to a non-phase-shifted substrate.

Figure 3A:
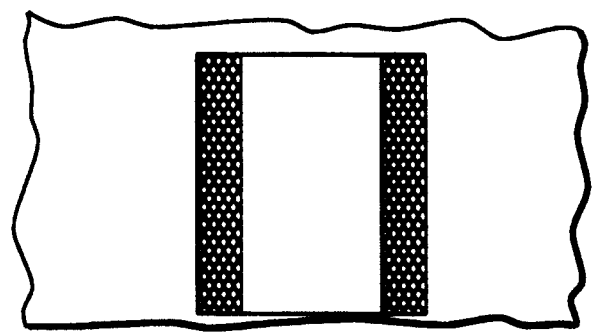
FIG. 3a is a planar view of an exposed test pattern formed in an object surface using a projection imagery system and the focus test pattern of FIG. 2, wherein minimum focus offset is noted.
Figure 3B:
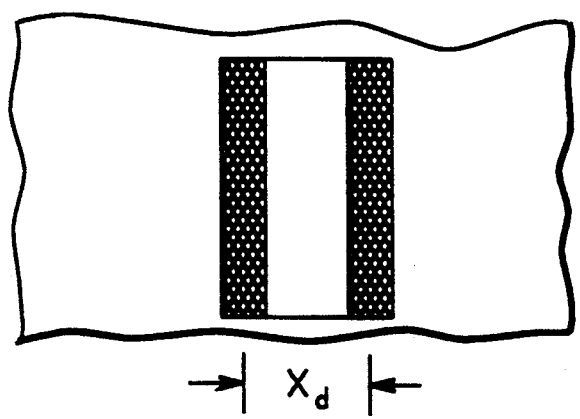
FIG. 3b is a planar view of an exposed test pattern formed on an object surface using a projection imagery system and the focus test pattern of FIG. 2, wherein a measurable change in space between projected lines is recorded.

When the mask pattern of FIG. 2 is used in a projection photolithography process, a test pattern will be created. In the case of a positive photoresist process, this pattern will consist of two lines of photoresist, for example, as shown in FIGS. 3a and 3b. Referring first to FIG. 3a, when in proper focus an identically dimensioned pattern is produced, i.e., there is no dimensional shift. Specifically, the center-to-center spacing "$X_f$" of the two resist lines on the surface of the wafer is identical to (or if a reduction lens is employed, directly proportional to) the spacing between shield lines 42 (FIG. 2) of the focus mask structure 40. Conversely, if the resultant test pattern formed on the upper surface of wafer 28 (FIG. 1) is other than identical (or directly proportional) to mask structure 40 then defocus is identified. The focus offset is quantified by evaluating the change in spacing between the two lines of the structure. FIG. 3b depicts a shifted structure wherein the center line to center line separation of the two lines "$X_d$" is representative of the magnitude of system defocus. The direction of focus offset corresponds to the increased/decreased separation of the two lines of the resultant test pattern formed on the upper surface of the substrate.

By deliberately optimizing the phase shift in an alternating phase shift/non-phase shift grating, a maximum sensitivity to focus change has been found using aerial image simulations. This optimum occurs at a phase shift difference of about 90° relative to a non-phase-shifted substrate and the sensitivity to defocus increases as the pitch decreases. In practice, a phase shifter anywhere in the range of 40°-140° would provide a preferred difference signal for evaluation, however, other phase shifter values may be used as long as there is a measurable phase shift differential between the phase shifter and the substrate. (In this discussion the phase shift is always understood as the relative phase shift between the phase shifter and the substrate, i.e., the phase shift of the substrate is assumed to be zero.) The phase shifter can be anything other than 0°, 180°, 360°, etc. (Obviously, the same windows could be repeated in the 180°-360° range if desired.)

Figure 4:
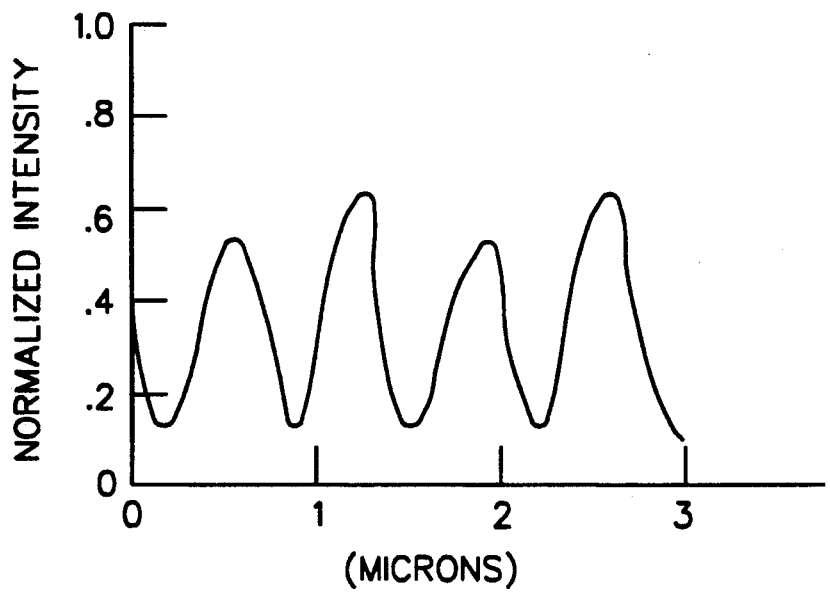
FIG. 4 is a calculated "aerial image profile" projected from a "Levenson" phase shift mask using 90° phase-shifted material, assuming a 0.35 micron grating and a 1 micron defocus.

By way of example, FIG. 4 shows a calculated aerial image profile for 0.35 micron line-spaced pairs exposed with a 90° Levenson phase shift mask at a defocus of 1 micron. The phase-shifted windows of the mask are shown to result in different peak intensity and different width values than adjacent non-phase-shifted windows. The difference of the width of adjacent lines is used as a focus metric, with the difference being zero when defocus is zero. On a stepper with an exposure wavelength of 248 nm, numerical aperture of 0.35 and a pupil filling factor of 0.37, the sensitivity of a focus monitor pursuant to the present invention has been found to be roughly 30% per micron. The effect of phase errors in the focus monitor structure is quite low. For example, little change in focus sensitivity is observed over a range of phases between 45° and 135°.

Figure 5:
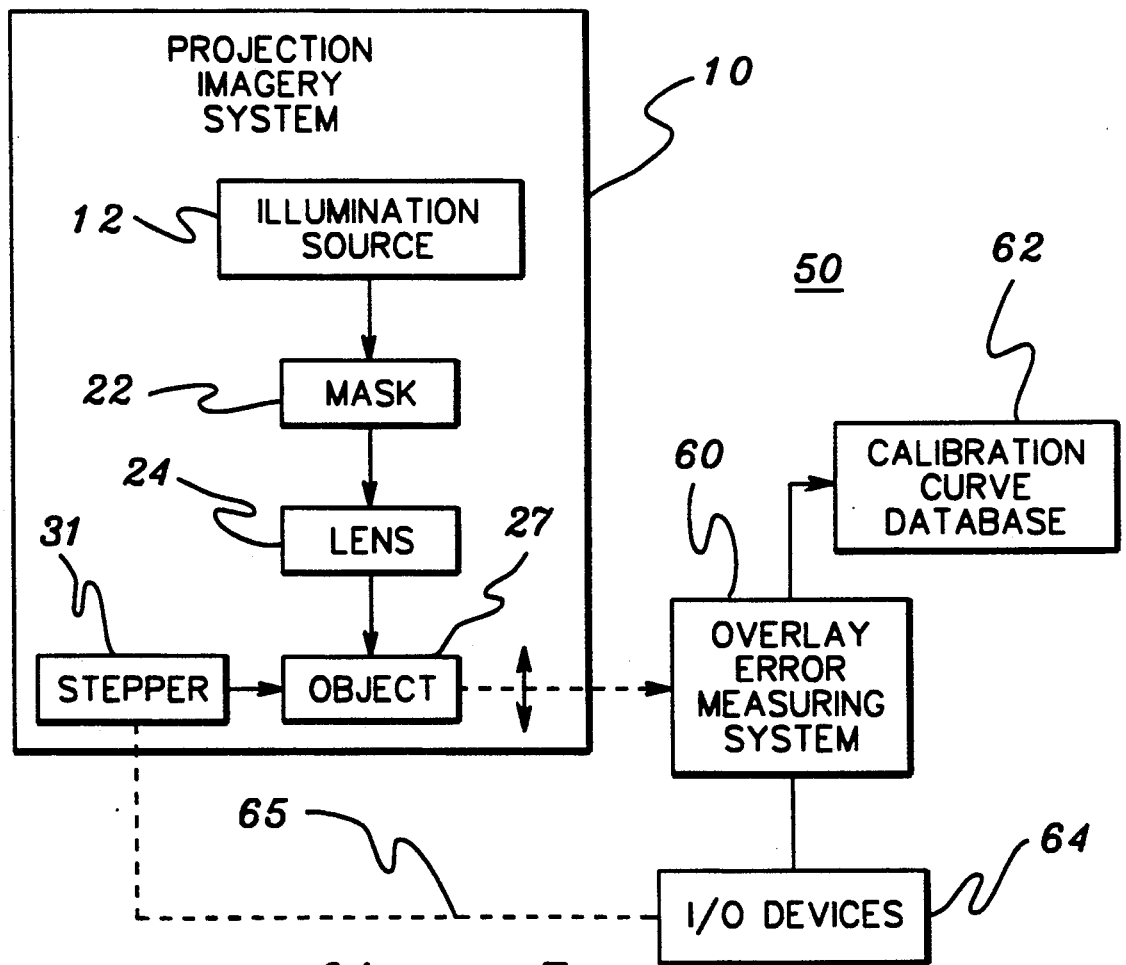
FIG. 5 is a block diagram of one embodiment of a focus monitoring system pursuant to the present invention.

Thus, in practice, a very compact structure (such as that depicted in FIG. 2 or the Levenson type described above) can be inserted into the optical kerf at each level of lithography. Visual inspection of the system under a microscope quickly and accurately provides a determination of the quality of focus, and if the focus is not perfect it will reveal whether the defocus is positive or negative. One generalized embodiment of a monitoring system, denoted 50, pursuant to the present invention is set forth in FIG. 5.

This monitoring system 50 is coupled to a projection imagery system 10 (first introduced in connection with FIG. 1) having an illumination source 12, mask structure 22, reduction lens 24, and an object 27 to be exposed (such as wafer 28 of FIG. 1). The object is controlled in the focus dimension (i.e., Z-axis dimension) by a stepper assembly 31 which, for example, is coupled to a vacuum chuck (not shown) upon which the object is positioned. Once a test pattern pursuant to the present invention is printed on the object, the pattern is optically evaluated in measuring system 60. If the pattern is measured by an automated linewidth measuring tool such as an SEM, scanning confocal microscope, or digitizing microscope, the linewidth difference between the alternating lines in the grating can be determined to give quantitative measurement of the amount of defocus. (Alternatively, the center-to-center spacing, as in FIGS. 3a and 3b, can be measured.) This information can provide unambiguous focus information on product wafers, for use in in-line monitoring or feedback to the exposure tool.

More particularly, system 60 could comprise an automated microscope in combination with appropriate preprestored databases, such as a calibration curve database 62, for use in translating a viewed image into a defocus error signal. Such an error signal could then be displayed or stored through appropriate I/O devices 64 for operator information, or employed as an automated feedback control signal (via line 65) to stepper assembly 31 for adjusting the Z-axis location of object 27 relative to the reduction lens assembly 24.

Figure 6:
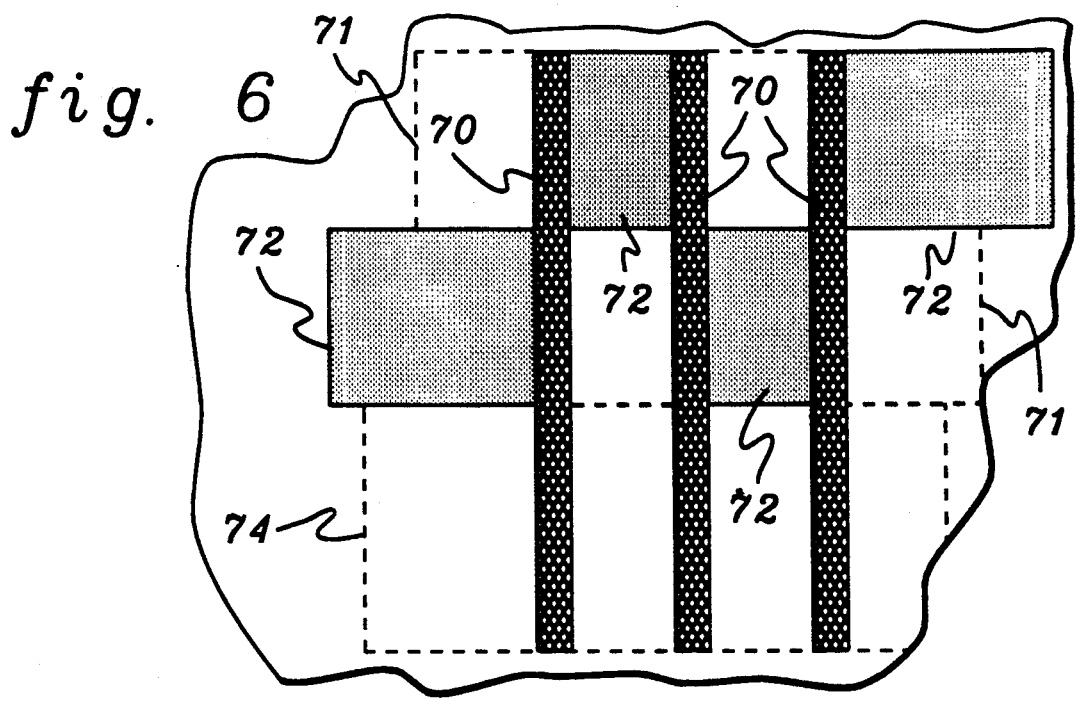
FIG. 6 is a planar view of another embodiment of a focus mask test pattern pursuant to the present invention.

FIG. 6 depicts another preferred form of a mask structure pursuant to the present invention. Again, the object of the test pattern is to establish a measurable shift when focus error is present. This pattern consists of three narrow shield lines 70 which are equally spaced in parallel opposing relation. 90° phase shifting windows 72 are offset as shown. Thus, two offset patterns 71 of alternating phase-shifted and non-phase-shifted windows are defined. Defocus results in a shift of the center line with respect to the two outer lines. This shift appears as an overlay error which can be measured by standard techniques. (The center line is preferably equally spaced between the two outer lines.) Further, with defocus the upper pattern 71 will shift in one direction while the middle pattern 71 shifts in the other direction. By taking the difference of the two shifts, a doubled effect (2×) is obtained. A third pattern 74 is also provided consisting of the three parallel lines between which is disposed only the non-phase-shifted substrate. This third pattern 74 of unshifted light can act as a control. The bottom third of the pattern 74 should show no shift.

Again, line shifts can be rapidly measured with excellent precision by established techniques, such as automated microscopes. Thus, pursuant to the invention focus errors are transformed into easily measured overlay errors of the center line relative to the outer two lines. Further, the lines of the structure can be oriented in any of several directions, such as horizontal, vertical, ± 45°, e.g., to measure the effects of an astigmatism. The chrome linewidth of the pattern can also be varied, with narrower lines providing greater sensitivity. The most useful range of linewidth is from zero to $0.5\lambda/NA$ (wherein NA means the 'numerical aperture'). (Note that if the chrome width goes to zero a chromeless focus pattern is described.) Again, the phase shift angle, nominally 90°, is not critical.

By way of example, a sample chrome width would be 0.4 μm with a pitch of 2.0 μm. One would expect that a "line-in-line" overlay measurement of the printed resist pattern would result in a null measurement. However, the 90° phase shift pattern (such as shown in FIG. 2 or FIG. 6) profoundly disrupts this symmetrical situation. Consider, for example, a narrow chrome line with no phase shift to the right and a 90° phase shift to the left. Simulation has shown that the printed resist line will shift to the right with positive focus offset and will shift to the left with negative focus offset. The focus monitor design pursuant to the present invention is such that the middle line shifts in the opposite direction from the two outer lines, resulting in a printed overlay error proportional to defocus. With specific reference to FIG. 6, the upper third of the pattern will shift one way, the middle third of the pattern shifts the opposite way, and the bottom third of the pattern, which is used as a control, should not shift.

Figure 7:
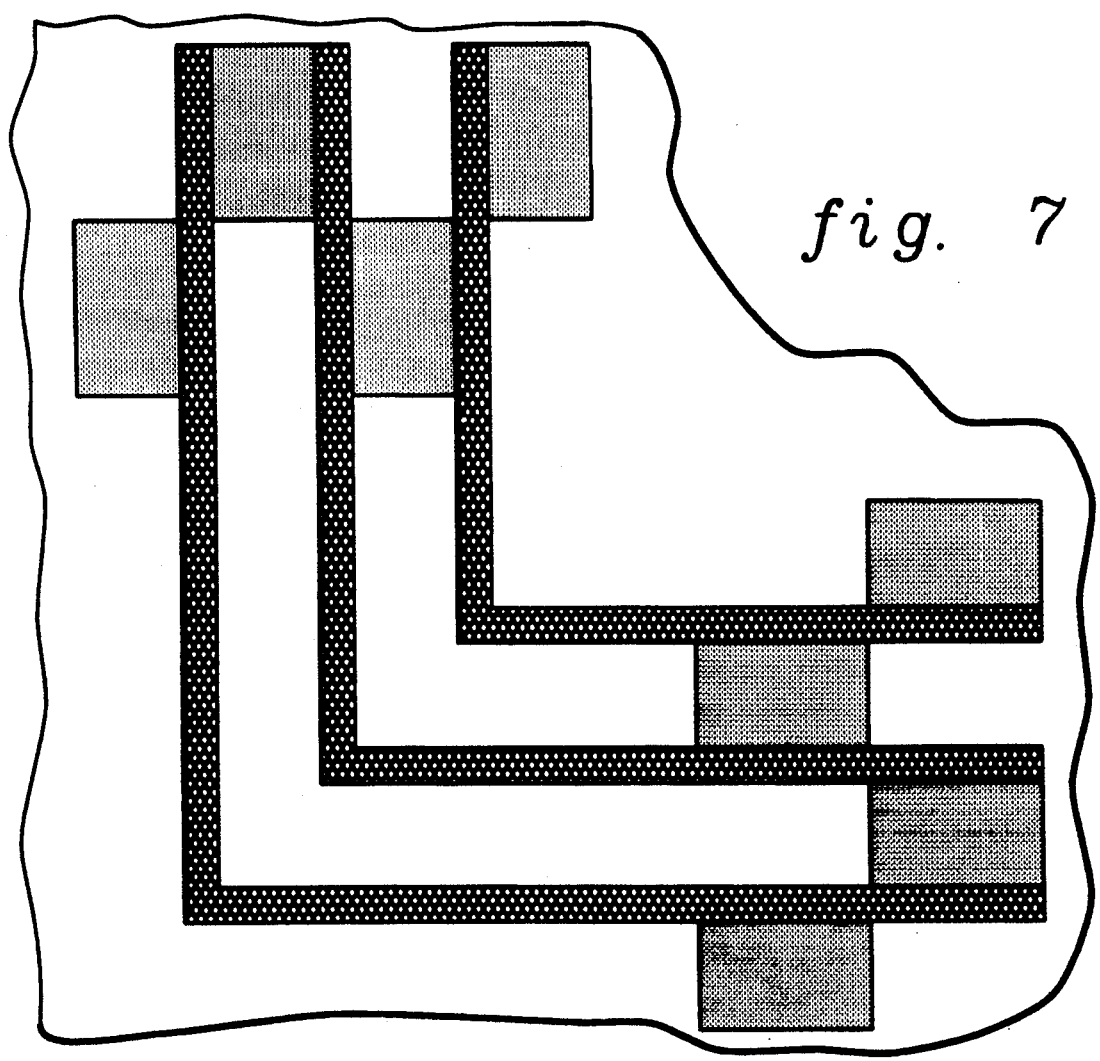
FIG. 7 is a planar view of yet another embodiment of a focus mask test pattern pursuant to the present invention.
Figure 8:
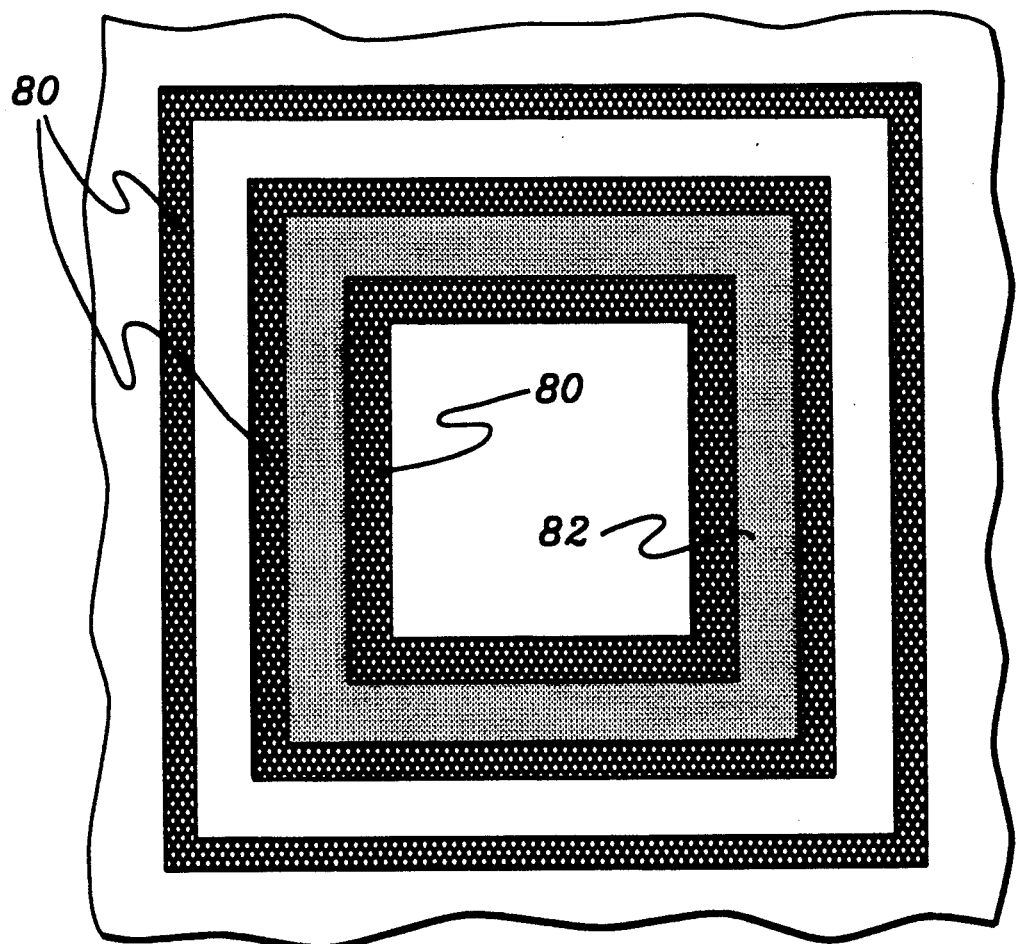
FIG. 8 is a planar view of still another embodiment of a focus mask test pattern pursuant to the present invention.

FIGS. 7 and 8 depict two further alternate embodiments of a focus test pattern pursuant to the present invention. FIG. 7 is essentially the embodiment of FIG. 6 with a horizontally disposed replication thereof integrally formed with the vertically oriented portion of the pattern. In the embodiment of FIG. 8, three concentric squares of shield lines 80 are arranged as shown with a phase shifting material 82 being disposed between the innermost and middle of the shield lines 80. The outer square 80 functions as a control to confirm the extent and direction of line shift resulting from phase shifter 82. In general, those skilled in the art will be able to devise still further alternating test configurations employing the concepts presented herein. The claims appended hereto are intended to encompass all such alternate embodiments.

Figure 9:
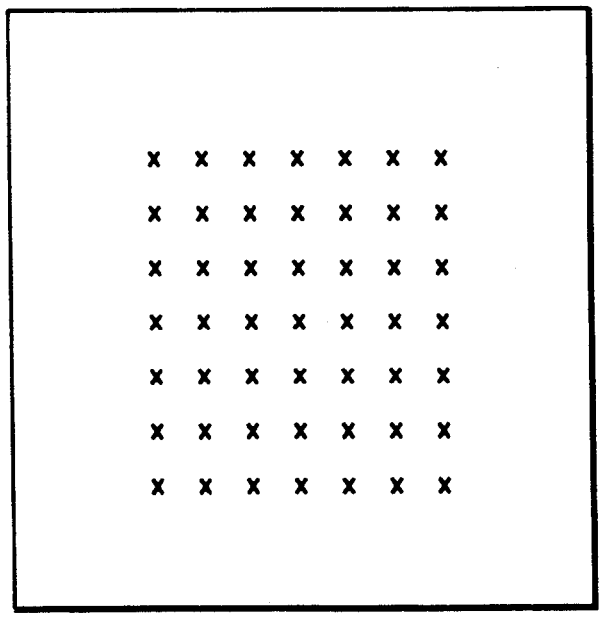
FIG. 9 is a planar view of a complete focus test mask consisting of a repetitive array of individual focus test patterns (which can be used to test variation in focus across the lens field, for example, due to lens aberrations)

FIG. 9 depicts a 7×7 array produced within a single lens field on a wafer surface. Such an array can be produced from a reticle comprising a repetition of any of the above-described test patterns. By methodically measuring defocus across the surface of each chip and therefore across the wafer, imperfections in the associated lens assembly of the wafer stepper can be identified and accurately located.

An automated test routine can be implemented in a number of ways pursuant to the present invention. As an example of a specific implementation, a focus pattern such as depicted in FIG. 6 is employed with overlay error being measured by a standard automated microscope, such as the Bio-Rad Q2 machine marketed by Bio-Rad of Mountainview, Calif. Overlay error is measured separately at the top third and middle third of the test pattern projected to the surface of a wafer. (Note that the bottom third of the pattern should repeatedly measure zero offset within a certain tolerance, e.g., ± 10 nm.) The total horizontal shift, dX, is the difference between the two measured overlay errors. Similarly, horizontally oriented lines could be measured in the same way at each measurement site, resulting in a measured vertical shift of the line dY.

Figure 10:
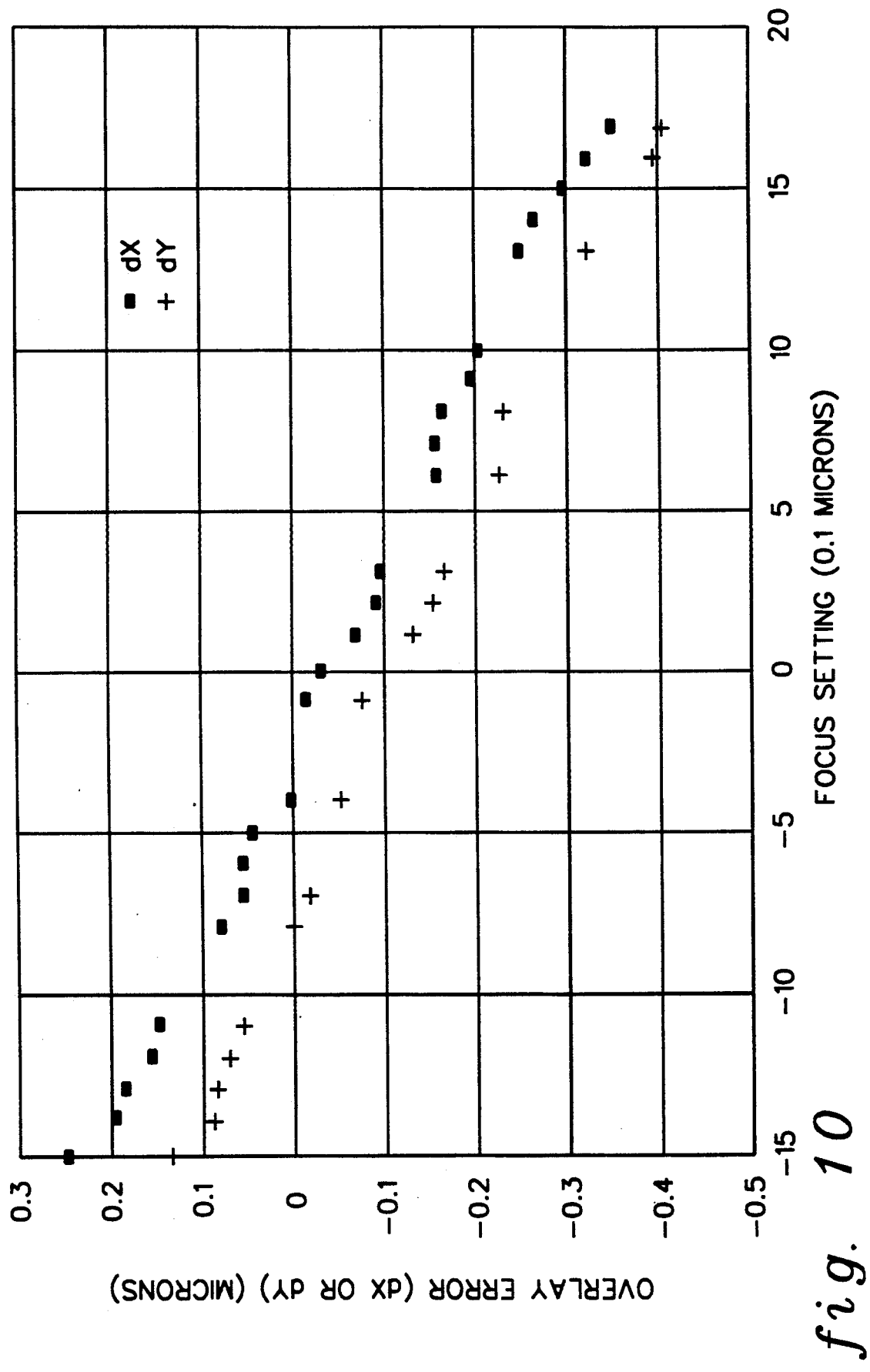
FIG. 10 is a sample graph of overlay error versus nominal focus position (defocus error) for various exposure values.

By Way of example, FIG. 10 shows the measured shifts for a "focus matrix" wafer with focus varying over a 3 micron range, measuring only the center pattern of each chip. The slope is approximately 0.170 μm overlay shift per 1 μm defocus. (Simulations have shown the slope to be approximately $0.4\lambda/NA$ shift per $\lambda/NA^2$ change in focus, or slope $0.4 \times NA$. For a conventional stepper, this predicts a slope of 0.18, in reasonable agreement with conducted experiments.) Notice that there is a constant difference between the vertical and horizontal results, i.e., an apparent astigmatism in the lens. The calibration curve of FIG. 10 suggest that the focus offset for vertical lines, $dZ_x$, and the focus offset for horizontal lines, $dZ_y$, are given by the following equations (1) & (2):

$$dZ_x = dX/0.17 - 0.5 \qquad (1)$$

$$dZ_y = dY/0.17 - 0.5; \qquad (2)$$

where both focus offsets and measured overlay shifts are in units of microns.

Figure 11:
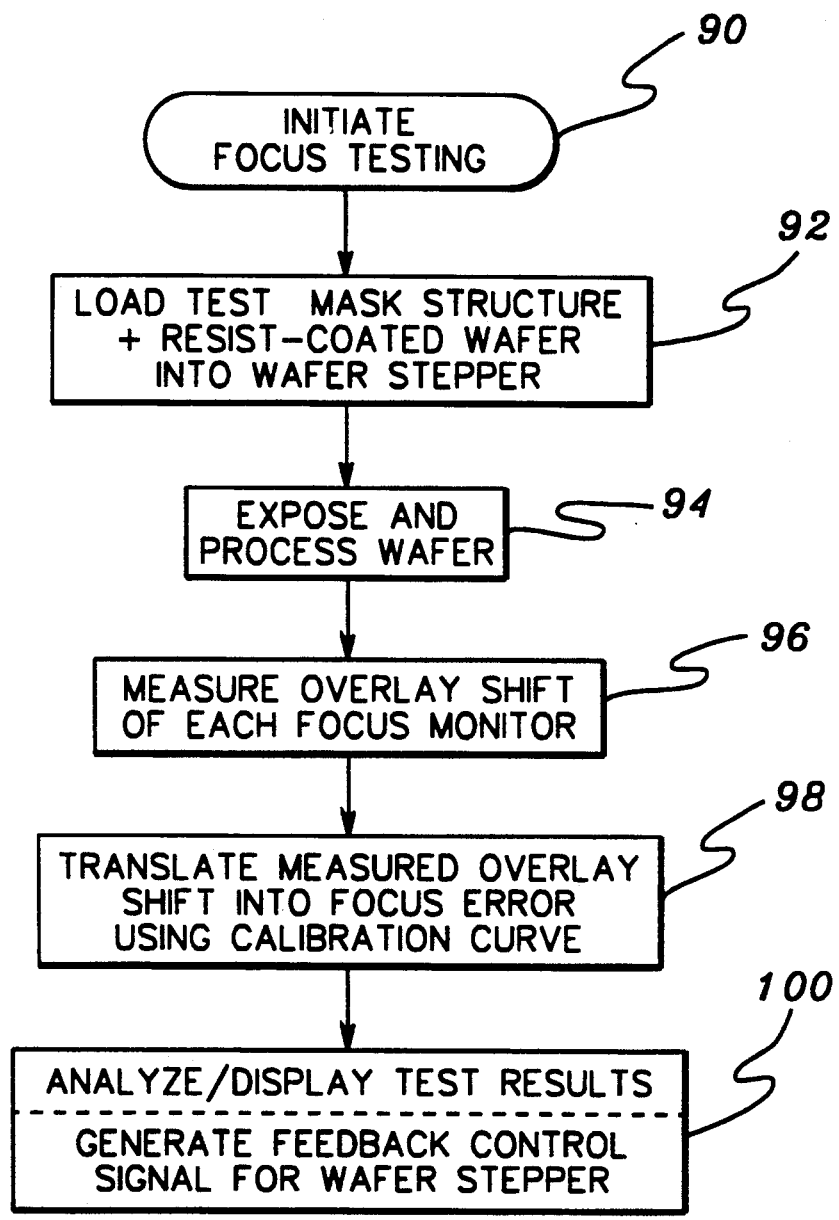
FIG. 11 is a flowchart of one embodiment of a focus testing procedure pursuant to the present invention.

One detailed embodiment of a focus testing procedure pursuant to the present invention is set forth in FIG. 11. Upon initiation of focus testing, 90 "Initiate Focus Testing," a test mask structure or test reticle is loaded into the wafer stepper, along with a resist-coated test wafer, 92 "Load Test Mask Structure & Resist-Coated Wafer Into Wafer Stepper." Preferably, the test wafer has an ultra-flat upper surface. A series of chips is then exposed onto the wafer. Next, the wafer is processed as normal, 94 "Expose and Process Wafer," including baking, development, etc., of the resist pattern disposed on the upper surface of the wafer.

The overlay shift of each exposed test pattern (or focus monitor) relative to the mask's test pattern is then measured, e.g., using a standard automated microscope, 96 "Measure Overlay Shift Of Each Focus Monitor." The measured overlay shift is translated into a focus error using pre-established calibration curves for the given test pattern. Such curves are preferably pre-generated by respectively stepping the wafer out of focus in both the positive and negative directions while measuring the resultant overlay offsets. Finally, the focus error can be either displayed or analyzed for an operator. For example, lens field tilt in X and Y dimensions, lens field curvature, lens astigmatism, etc., can all be readily obtained from the focus error reading. Additionally, a feedback control signal could conceivably be generated to assist an operator in refocusing the wafer relative to the lens system or fedback to the lens system (e.g., to stepper 31) shown in FIG. 5.

There are a number of possible applications for the techniques presented herein. For example, a 90° Levenson grating structure such as that described above could be used to improve the accuracy of the conventional focus matrix method of determining focus. Using a non-phase-shifted structure, best focus is usually determined by looking for the maximum or minimum size of a small structure in a resolution target. When printed out of focus in either direction, the size of the structure falls away from the extreme value that it reaches at best focus. But with an optimized phase grating, the linewidth difference between two adjacent lines is the observable measure of best focus. This value will be positive on one side of focus and negative on the other side. In general, a zero crossing is an inherently more accurate measurement than finding an extremum. Also, automated focus determinations on lithographic exposure tools usually work by making several tests of an aerial image through focus and determining an extreme value of image size or a maximum value of image contrast. The same advantage of finding a zero crossing could be exploited by these automated techniques if they are modified to look for differences in linewidth in the focus test pattern. There is likely to be an improvement in both speed and accuracy of focus determination, just as in the case of visually measured focus matrices.

In addition, a stepper usually "auto-focuses" on each individual chip. It is difficult to test the accuracy and repeatability of such an auto-focus because most focus tests require a range of focuses. A corrupt auto-focus system might give inconsistent focus from chip to chip. The focus sensing technique presented herein would allow the focus of each individual chip (or lens field) to be readily measured. Thus, assessment of the accuracy and repeatability of the auto-focus system is direct and simple. Finally, the focus metrology structures can be used to measure phase errors of nominally 180° shifter structures. The magnitude of the effect is proportional to the sine of the phase angle, and thus there is first order sensitivity to phase errors. In practice, experimental curves could be obtained and the slope of the curve would reveal phase errors.

To summarize, traditional methods of determining focus involve multiple measurements of exposures made through a range of focus values. The techniques presented herein allow focus determination on actual product wafers. This is in contrast to all other methods which require use of a send-ahead focus matrix wafer which must be reworked, or which involve an indirect measurement of tool focus, which depends on mechanical stability of the system to give accurate focus on the product wafer. The techniques presented are expected to yield great benefits in focus control on future products, and should be readily applicable to all existing programs.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. For example, other mask test patterns can be designed by those skilled in the art utilizing the concepts of the present invention.

By way of further example, a window of phase shift material could be employed in a chromeless pattern. Experience has demonstrated that using available photolithography equipment edges will print with such a structure in the photoresist. These edges may be used as a reference to determine the direction and magnitude of defocus pursuant to the present invention. Other examples include the use of a single chrome line with a positive 90° phase shift window on one side and a negative 90° phase shift window on the other side, such that the photoresist linewidth changes with focus error. Such structures could be disposed in opposing relation in the mask, with the result that a very strong shifting effect is recorded in the photoresist with system defocus. Further, a chrome line with a 90° phase-shift window on one side and a 90° phase-shift window on the other side could be employed. Numerous other mask patterns are possible, and the following claims are intended to encompass all such modifications.

We claim:

1. A focus test mask for use in a projection imagery system, said focus test mask projecting on an object surface a test pattern which allows quantification of system defocus, said focus test mask comprising:

a substrate which allows light to pass therethrough; and a phase shift pattern associated with said substrate and shifting light passing therethrough by other than 180° in relation to light passing through said substrate to produce a phase difference between light passing therethrough and light passing through said substrate, wherein when said phase shift pattern is optically projected by said system onto the surface of an object, the direction and magnitude of optical defocus is determinable by measuring dimensions of the projected test pattern.

2. The focus test mask of claim 1, wherein said phase shift pattern shifts the phase of light passing therethrough in the range of 40°-140° in comparison with light passing through said substrate.

3. A focus test mask for use in a projection imagery system, said focus test mask projecting on an object surface a fine test pattern which allows quantification of system defocus, said focus test mask comprising:

a transparent substrate which allows light to pass therethrough;

a first opaque line and a second opaque line disposed in association with said transparent substrate, said first opaque line and said second opaque line having a predefined spacial relationship; and a phase shift window associated with said substrate and shifting light passing therethrough by other than 180° in relation to light passing through said transparent substrate to produce a phase difference between light passing therethrough and light passing through said substrate, said phase shift window being disposed between said first and second opaque lines, wherein when said pattern is optically projected by said system onto the surface of an object, the direction and magnitude of optical defocus is determinable by measuring the center-to-center spacing of the test pattern projected onto the object surface.

4. The focus test mask of claim 3, wherein said transparent substrate comprises substantially non-phase-shifted material such that an alternating phase-shifted test pattern is produced which comprises a phase shift grating of non-phase-shifted material and phase-shifted material.

5. The focus test mask of claim 3, wherein said phase shifter window shifts the phase of light passing therethrough in the range of 40°-140° in comparison with light passing through said substrate.

6. The focus,, test mask of claim 5, wherein said phase shift window shifts the phase of light passing therethrough approximately 90° in relation to light passing through said substrate.

7. The focus test mask of claim 4, further comprising a plurality of opaque lines associated with said transparent substrate in spaced, parallel opposing relation, and wherein said phase shift window and the non-phase-shifted substrate are disposed across said plurality of lines in a first alternating test pattern of phase-shifted material and non-phase-shifted material.

8. The focus test mask of claim 7, further comprising a second alternating test pattern of phase-shifted material and non-phase-shifted material disposed across said plurality lines, said first alternating test pattern and said second alternating test pattern being offset such that when imaged by said system onto the surface of an object, said test patterns shift in opposite directions to obtain a 2× magnification of the focus offset.

9. The focus test pattern of claim 3, wherein said opaque lines each have a vertically extending line portion and a horizontally extending line portion and are disposed such that said vertical line portions are in spaced parallel opposing relation and said horizontal line portions are in spaced parallel opposing relation.

10. A focus test mask for use in a projection imagery system, said focus test mask projecting a fine test pattern on an object surface for quantification of system defocus, said focus test mask comprising:

a transparent substrate;

a first opaque line, a second opaque line and a third opaque line formed in association with said substrate, said opaque lines having a predefined spacial relationship, with said second opaque line disposed between said first opaque line and said third opaque line;

a first window of phase shift material formed in association with said substrate to produce a phase difference of other than 180° between light passing therethrough and light passing through said transparent substrate, said first phase shift window being disposed partially between said first opaque line and said second opaque line; and a second window of phase shift material formed in association with said substrate to produce a phase difference of other than 180° between light passing therethrough and light passing through said substrate, said second phase shift window being disposed partially between said second opaque line and said third opaque line, said second phase shift window being offset relative to said second opaque line from said first phase shift window such that two alternating patterns of substrate and phase-shifted windows are formed transverse said opaque lines, wherein when projected onto an object's surface, measurements of the alternating test patterns can be combined for a magnified reading of the focus offset, the direction and magnitude of optical defocus being determinable by measuring the displacement of the center of the second line relative to the first and third lines.

11. The focus test mask of claim 10, wherein light passing through said transparent substrate is substantially non-phase-shifted, and wherein light passing through said first phase shift window is shifted substantially equally in relation to light passing through said substrate as light passing through said second window of phase shift material, each of said windows as phase shift material shifting the phase of light passing therethrough in the range of 40°-140° in comparison with non-phase-shifted light passing through said substrate, and wherein said second opaque line is equally spaced between said first opaque line and said third opaque line.

12. The focus test mask of claim 11, wherein said phase shift material of said first window and said second window shifts light passing therethrough approximately 90° in relation to non-phase-shifted light passing through said substrate.

13. The focus test mask of claim 10, wherein said opaque lines extend sufficiently past said two alternating test patterns to define a control test pattern wherein said opaque lines are separated by only said non-phase-shifted substrate.

14. The focus test mask of claim 10, wherein said opaque lines each ave a vertically extending line portion and a horizontally extending line portion and are disposed such that said vertical line portions are in spaced parallel opposing relation and said horizontal line portions are in spaced parallel opposing relation, said vertical line portions and said horizontal line portions each having said two alternating patterns of substrate and phase-shifted windows transversely formed across said opaque lines.

15. A focus test mask for use in a projection imagery system, said focus test mask projecting on an object surface a fine test pattern which allows quantification of system defocus, said focus test mask comprising:
a substantially non-phase-shifted, transparent substrate;
a first opaque line forming a closed geometric shape and a second opaque line forming the same closed geometric shape, said first opaque line and said second opaque line being of different size and concentrically disposed in association with said substrate surface such that said geometric shapes have a predefined spacial relationship; and
a phase shifter associated with said substrate and shifting light passing therethrough by other than 180° to produce a phase difference between light passing therethrough and light passing through said non-phase-shifted substrate, said phase shifter being disposed between said first and second opaque lines such that an alternating pattern of non-phase-shifted material and phase-shifted material is defined transverse said spaced lines, wherein when said alternating test pattern is optically projected by said system onto the surface of an object, the direction and magnitude of optical defocus is determinable by measuring the center-to-center spacing of the lines projected onto the substrate surface.

16. The focus test mask of claim 15, wherein said phase shifter has a phase angle which maximizes the measurable shift in the projected test pattern per unit defocus.

17. The focus test mask of claim 15, further comprising a plurality of opaque lines associated with said transparent substrate, each of said opaque lines forming the same closed geometric shape, said lines being of different size and disposed such that said closed geometric shapes are concentrically arranged, and wherein said phase shifter and said non-phase-shifted substrate are disposed in an alternating test pattern of phase-shifted material and non-phase-shifted material transverse said plurality of opaque lines.

18. The focus test mask of claim 15, wherein said closed geometric shape comprises a rectangular shape.

19. An optical defocus monitoring system for use with a projection imagery system having an illumination source and a focus lens, said monitoring system comprising:
a focus test mask for disposition between said illumination source and said focus lens for projecting a fine test pattern on an object surface which allows quantification of imagery system defocus, said focus mask including a substrate which allows light to pass therethrough,
a phase shift pattern associated with said substrate and shifting light passing therethrough by other and than 180° in relation to light passing through said substrate to produce a phase difference between light passing therethrough and light passing through said substrate; and
means for evaluating said fine test pattern once projected by said imagery system onto an object surface by measuring the dimensions of said projected test pattern.

20. The optical defocus monitoring system of claim 19, wherein said evaluating means is automated.

21. The optical defocus monitoring system of claim 20, further comprising pre-stored calibration curves correlating measured projected pattern dimensions with imagery system defocus errors, and wherein said monitoring system further comprises means for translating a determined projected pattern dimensions into a defocus error by reference to said database of calibration curves.

22. The optical defocus monitoring system of claim 21, further comprising means for analyzing said defocus error.

23. The optical defocus monitoring system of claim 21, further comprising means for displaying said defocus error.

24. The optical defocus monitoring system of claim 19, wherein said system is used to monitor the defocus on a surface of a semiconductor wafer, and wherein said focus test mask is combined with a product mask such that said test pattern is disposed within the kerf of said product mask.

25. The optical defocus monitoring system of claim 19, wherein said imagery system further includes an adjustable mechanized stepper for positioning an object surface relative to said focus lens, and wherein said monitoring system is employed to verify the accuracy of said adjustable stepper mechanism, said focus test mask comprising a reticle wherein said alternating test pattern is repeated in an array across said reticle.

26. The optical defocus monitoring system of claim 19, wherein said evaluating means includes means for measuring one of the projected pattern pitch, linewidth and overlay shift as representative of imagery system defocus.

27. In a projection imagery system having a focus lens, a method for monitoring the optical defocus of an object surface, said monitoring method comprising the steps of:
(a) providing a focus test mask having a non-phase-shifted, transparent substrate, first and second opaque lines formed in association with said substrate in a predetermined spacial relationship and a window, of phase shift material disposed between said opaque lines such that an alternating test pattern of non-phase-shifted material and phase-shifted material is defined transverse said opaque lines, said phase shift window producing a phase difference of other than 180° between light passing therethrough and light passing through said non-phase-shifted substrate;
(b) illuminating said focus test mask to project said alternating test pattern onto an object surface through said imagery system's focus lens; and
(c) measuring center-to-center spacing of two lines of said projected test pattern, said measured spacing being representative of optical defocus.

28. The monitoring method of claim 27, further comprising the step of processing said object surface to expose said test pattern projected thereon, and wherein said center-to-center spacing measuring step (c) includes evaluating the center-to-center spacing between two resist lines in said exposed test pattern.

29. The monitoring method of claim 27, further comprising the step of translating center-to-center spacing measured in said step (c) into a defocus error value.

30. The monitoring method of claim 29, further comprising the step of pre-storing a calibration curve correlating measured center-to-center spacing with corresponding defocus errors, and wherein said center-to-center spacing translating step includes referencing said calibration curve to attain a defocus error, value corresponding to the measured spacing of said step (c).

* * * * *

UNITED STATES PATENT AND TRADEMARK OFFICE
CERTIFICATE OF CORRECTION

PATENT NO. : 5,300,786
DATED : Apr. 5, 1994
INVENTOR(S) : Brunner et al.

It is certified that error appears in the above-indentified patent and that said Letters Patent is hereby corrected as shown below:

Column 9, line 5, delete "curve" and substitute therefor --curves--.

<u>In The Claims</u>:

Column 11, line 48 delete ",,".

Column 11, line 62 between "plurality" and "lines" insert --of--.

Col. 12, line 47, "windows as of phase" should read --windows of phase--.

Column 12, line 65 delete "ave" and substitute therefor --have--.

Signed and Sealed this

Sixth Day of September, 1994

Attest:

BRUCE LEHMAN

Attesting Officer

Commissioner of Patents and Trademarks